(12) United States Patent
Jang

(10) Patent No.: US 8,174,064 B2
(45) Date of Patent: May 8, 2012

(54) SEMICONDUCTOR DEVICE AND METHOD FOR FORMING THE SAME

(75) Inventor: Chi Hwan Jang, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 122 days.

(21) Appl. No.: 12/835,449

(22) Filed: Jul. 13, 2010

(65) Prior Publication Data

US 2011/0254082 A1    Oct. 20, 2011

(30) Foreign Application Priority Data

Apr. 15, 2010   (KR) .................. 10-2010-0034756

(51) Int. Cl.
*H01L 29/66* (2006.01)
(52) U.S. Cl. ................ 257/330; 257/331; 257/E21.177; 257/E29.134; 438/270; 438/589
(58) Field of Classification Search .................. 257/330, 257/331, E29.134, E21.177; 438/270, 589
See application file for complete search history.

(56) References Cited

U.S. PATENT DOCUMENTS

| | | | | |
|---|---|---|---|---|
| 6,906,372 | B2 * | 6/2005 | Yamada et al. | 257/301 |
| 2007/0072375 | A1 * | 3/2007 | Yamazaki | 438/270 |
| 2011/0037111 | A1 * | 2/2011 | Kim et al. | 257/302 |

* cited by examiner

*Primary Examiner* — Trung Q Dang

(57) ABSTRACT

A semiconductor device includes a conductive pattern formed on the substrate; an interlayer dielectric layer formed on the conductive pattern; a contact plug connected to the conductive pattern extending through the interlayer dielectric layer; a semiconductor layer and an insulating layer sequentially formed on the interlayer dielectric layer; an electrode pattern formed on the insulating layer; and a capping insulating layer pattern covering upper portions of neighboring electrode patterns with the contact plug. An additional process is not needed to define an active region. An active region apart from the gate patter is not needed. A storage electrode contact line does not need to be formed. A height of a landing plug is reduced to reduce the landing plug resistance. A junction region does not need to be formed.

38 Claims, 11 Drawing Sheets

SEMICONDUCTOR DEVICE AND METHOD FOR FORMING THE SAME

CROSS-REFERENCES TO RELATED APPLICATIONS

The present application claims priority to Korean patent application number 10-2010-0034756, filed on Apr. 15, 2010, which is incorporated by reference in its entirety.

BACKGROUND OF THE INVENTION

The present invention relates to a method for forming a semiconductor device, and more particularly, to a semiconductor device including a bit line provided at a lower portion of a gate and a method for forming the same.

In recent years, most electronic appliances include semiconductor devices. A semiconductor device includes electronic elements such as transistors, resistors, capacitors, and the like which are then integrated on a semiconductor substrate. The electronic elements are designed to execute partial functions of the electronic appliances. For example, electronic appliances such as a computer or a digital camera include semiconductor devices such as a memory chip for storing information and a processing chip for controlling the information. The memory chip and the processing chip include electronic elements integrated on a semiconductor substrate.

In order to satisfy memories of large quantity, excellent performance and cheap cost, there is a need for highly integrated semiconductor devices. For this reason, a design rule applied to a design of a semiconductor device inevitably decreases. Accordingly, so as to form more patterns in a limited region, a denser pattern should be formed by reducing a line width of the patterns. However, since there is a limitation in forming smaller patterns due to the limitation of the resolution, it is difficult to form the denser pattern using an exposure source. Furthermore, as a line width of a semiconductor device pattern is reduced, defects such as a short channel effect can occur to deteriorate the characteristics of a transistor.

Accordingly, there have been proposed various methods to form highly integrated semiconductor devices in a limited area. For example, a recess gate and a buried gate have been proposed instead of a planar gate used in the related art. In the recess gate a semiconductor substrate is etched to a predetermined thickness to form a recess, and a gate is then formed in an upper portion of the recess. The recess gate is advantageous in that an occupied area of a conventional horizontal channel region is reduced. In the buried gate a semiconductor substrate is etched to a predetermined thickness to form a recess, and the whole gate is then buried in the recess. An area of the buried gate is reduced in comparison with the recess gate.

Additionally, a fin type gate has a fin channel structure in which a tri gate wraps a channel. The fin channel structure can be manufactured in a three-dimensional structure without departing from conventional manufacturing technology. Since the fin channel structure has excellent gate control force due to structural properties to decrease short channel effect, it may minimize influence between a drain region and a source region. Moreover, the fin channel structure may reduce a channel doping density, thereby improving a leakage current through a junction region.

However, in the recess gate, the buried gate, and the fin type gate, the manufacturing process is complicated which increases the number of processes. This causes self align contact (SAC) defects, which leads to a reduction in reliability of a semiconductor device.

Furthermore, there has been suggested an arrangement forming a buried bit line which buries a bit line in a semiconductor substrate. However, it increases the number of masks used to form the buried bit line, thereby increasing the cost and the time.

BRIEF SUMMARY OF THE INVENTION

Embodiments of the present invention are directed to solve deterioration in the productivity of a highly integrated semiconductor device due to the increased time and cost in forming the semiconductor device.

According to an embodiment of the present invention, a semiconductor device comprises a conductive pattern formed over a substrate, an interlayer dielectric layer formed over the conductive pattern, a contact plug extending through the interlayer dielectric layer to contact the conductive pattern, a semiconductor layer provided over the contact plug and the interlayer dielectric layer, an insulating layer provided over the semiconductor layer, an electrode pattern provided over the insulating layer, and a capping insulating layer pattern covering upper portions of neighboring electrode patterns provide at side portion of the contact plug.

The substrate is formed of glass or a polymer material.

The substrate is a silicon substrate.

In accordance with an embodiment of the present invention, a semiconductor device includes further comprises an isolation insulating layer formed between the substrate and the conductive pattern.

The isolation insulating layer is formed of an oxide material, a nitride material, a carbide material, or a polymer material with carbon as a material having a low dielectric constant.

The interlayer dielectric layer is formed of an oxide material, a nitride material, a carbide material, or a polymer material with carbon as a material having a low dielectric constant.

The conductive pattern is a bit line.

The conductive pattern is formed of tungsten or copper.

The semiconductor layer is formed of Si, SiGe, Ge, SiC, Ga, or As.

The semiconductor layer has a thickness of 5.5 Å to 60 Å.

The semiconductor layer includes a silicon atom layer configured by a monolayer.

The semiconductor layer includes a silicon atom layer configured by a multilayer.

The electrode pattern is formed of a metal material, a semiconductor material, a silicide material, or a silicate material.

The electrode pattern is formed of graphene.

In accordance with an embodiment of the present invention, a semiconductor device further includes landing plugs provided at both sides of the capping insulating layer pattern to be connected with the semiconductor layer, respectively.

According to another embodiment of the present invention, a semiconductor device comprises a conductive pattern formed over a substrate, an interlayer dielectric layer formed over the conductive pattern, a contact plug extending through the interlayer dielectric layer to contact the conductive pattern, a sub semiconductor layer provided over the contact plug and the interlayer dielectric layer, a semiconductor layer provided over an insulating layer and the sub semiconductor layer, an insulating layer provided over the semiconductor layer, an electrode pattern provided over the insulating layer and a capping insulating layer pattern covering upper portions of neighboring the electrode pattern provided at side portion of the contact plug.

The sub semiconductor layer is formed of Si, SiGe, Ge, SiC, Ga, or As.

In accordance with another embodiment of the present invention, a semiconductor device further includes landing plugs contacting the sub semiconductor layer that is provided side portion of the capping insulating layer.

According to an embodiment of the present invention, a method of manufacturing a semiconductor device includes: forming a conductive pattern over a substrate, forming an interlayer dielectric layer over the conductive pattern, forming a contact plug extending through the interlayer dielectric layer to contact the conductive pattern, forming an insulating layer over the semiconductor layer, forming a electrode pattern over the insulating layer, and forming a capping insulating layer pattern covering upper portions of neighboring the electrode pattern at side portion of contact plug.

In accordance with an embodiment of the present invention, after providing a substrate, a method of manufacturing a semiconductor device further includes forming an isolation insulating layer on the substrate.

Forming a conductive pattern is performed by a damascene process.

Forming a conductive pattern includes: depositing a conductive material on the substrate; forming a photo resist pattern on the conductive material by exposure or development processes; and etching the conductive material by using the photo resistor pattern as an etch mask.

In accordance with an embodiment of the present invention, after forming the contact plug, a method of manufacturing a semiconductor device further includes: forming a hard mask pattern at an upper portion of the interlayer dielectric layer; and etching the interlayer dielectric layer by using the hard mask pattern as an etch mask to form a recess.

Forming a semiconductor layer is performed by chemical vapor deposition, physical vapor deposition, or atomic layer deposition.

In accordance with an embodiment of the present invention, after forming a semiconductor layer, a method of manufacturing a semiconductor device further includes: performing heat treatment or plasma treatment with respect to the semiconductor layer.

In accordance with an embodiment of the present invention, after forming a semiconductor layer, a method of manufacturing a semiconductor device further includes implanting ions into the semiconductor layer.

Forming an insulating layer is performed by chemical vapor deposition, physical vapor deposition, or atomic layer deposition.

Forming an electrode pattern includes: forming an electrode layer on the insulating layer; and performing an etchback or planarization etch process with respect to the electrode layer.

Performing an etch-back process with respect to the electrode layer removes the electrode layer by using the insulating layer as an etch stopping layer.

In accordance with an embodiment of the present invention, after forming a capping insulation layer, a method of manufacturing a semiconductor device further includes removing the insulating layer on the semiconductor layer by using the capping insulating pattern as a mask.

In accordance with an embodiment of the present invention, after removing the insulating layer, a method of manufacturing a semiconductor device further includes forming landing plugs respectively provided at both sides of the capping insulating layer pattern to be connected to the semiconductor layer.

According to another embodiment of the present invention, a method of manufacturing a semiconductor device, includes: forming a conductive pattern over a substrate, forming an interlayer dielectric layer on the conductive pattern, forming a contact plug extending through the interlayer dielectric layer to contact the conductive pattern, forming a sub semiconductor layer on the interlayer dielectric layer, forming a semiconductor layer over the contact plug and the sub semiconductor layer, forming an electrode pattern over the insulating layer, and forming a capping insulating layer pattern covering upper portions of neighboring the electrode pattern at side portion of contact plug.

Forming a sub semiconductor layer is performed by chemical vapor deposition, physical vapor deposition, or atomic layer deposition.

In accordance with another embodiment of the present invention, after forming a sub semiconductor layer, a method of manufacturing a semiconductor device further includes performing heat treatment or plasma treatment with respect to the sub semiconductor layer.

In accordance with another embodiment of the present invention, after forming a sub semiconductor layer, a method of manufacturing a semiconductor device further includes implanting ions into the sub semiconductor layer.

In accordance with another embodiment of the present invention, after forming the sub semiconductor layer, a method of manufacturing a semiconductor device further includes: forming a hard mask pattern in an upper portion of the interlayer dielectric layer, and etching the sub semiconductor layer and the interlayer dielectric layer by using the hard mask pattern as an etch mask to form a recess.

In accordance with another embodiment of the present invention, after forming a capping insulation layer, a method of manufacturing a semiconductor device further includes performing cleaning to remove the insulating layer and the semiconductor layer by using the capping insulating pattern as a mask.

In accordance with another embodiment of the present invention, after removing the insulating layer and the semiconductor layer, a method of manufacturing a semiconductor device further includes forming a landing plug connected to the sub semiconductor layer.

A semiconductor device a method for forming the same according to the present invention provides one or more advantages listed below.

First, an additional process for defining an active region is not required so a process time is reduced. Further, since a separate active region is absent, high integration in a cell region is possible.

Second, a storage electrode contact is not formed and the number of masks used to form a storage electrode contact plug and the cost may be reduced.

Third, a thickness of a landing plug is reduced to reduce landing plug resistance, thereby reducing a defective rate and improving the characteristics of semiconductor devices.

Fourth, a junction region does not need to be defined so the number of masks used to form the junction region and the cost may be reduced.

Fifth, a junction region is not needed so the occurrence of a leakage current is reduced.

Sixth, the SAC defect caused while forming a bit line may be prevented.

DESCRIPTION OF EMBODIMENTS

Embodiments of the present invention are described with reference to the accompanying drawings in detail.

Figure 1:
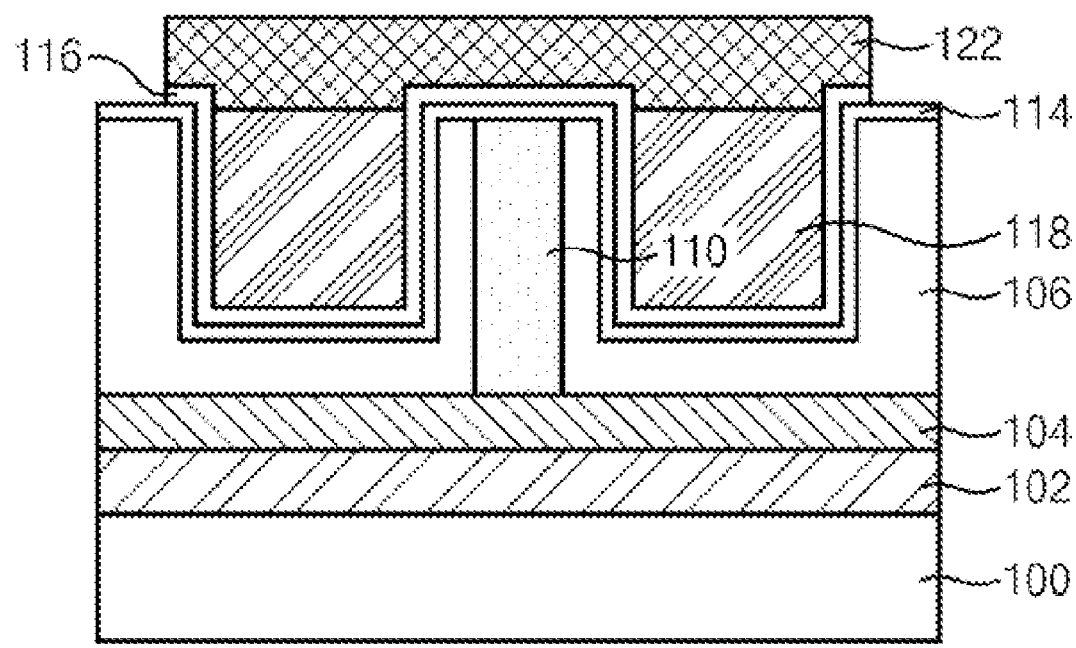
FIG. 1 is a cross-sectional view illustrating a semiconductor device according to a first embodiment of the present invention.

Referring to FIG. 1, a semiconductor device according to a first embodiment of the present invention includes: a substrate 100, a conductive pattern 104 formed on the substrate 100, an interlayer dielectric layer 106 formed on the conductive pattern 104 and including a recess, a contact plug 110 connected to the conductive pattern 104 penetrating the interlayer dielectric layer 106, a semiconductor layer 114 and an insulating layer 116 sequentially formed on the interlayer dielectric layer 106 to be connected to the contact plug 110, an electrode pattern 118 formed on the insulating layer 116, and a capping insulating layer pattern 122 covering upper portions of neighboring electrode patterns 118.

In the present embodiment, for the purpose of illustration in a structure of a recess gate, the interlayer dielectric layer 106 with the recess has been described by way of example. However, the interlayer dielectric layer 106 does not always include the recess. For example, a flat interlayer dielectric layer 106 is applicable.

The substrate 100 may be formed of glass or a polymer material. When the substrate 100 is formed of a polymer material, its practical use can be extended due to its significantly flexible characteristics. When a silicon substrate is applied as the substrate 100, an isolation insulating layer may further be formed for the purpose of insulation between the substrate and the conductive pattern 104. The isolation insulating layer 102 may be formed of an oxide material, a nitride material, a carbide material, or a polymer material with carbon as a material having a low dielectric constant.

The conductive pattern 104 is a bit line electrode. The conductive pattern 104 may be formed of tungsten (W) or copper (Cu). A barrier layer (not shown) can further be provided under the conductive pattern 104. The barrier layer may be formed of metal (e.g., Ti, Ta, or Mo), metal nitride (e.g., TiN, TaN, or MoN), metal oxide, or metal carbide. Furthermore, the interlayer dielectric layer 106 may be formed of an oxide material, a nitride material, a carbide material, or a polymer material with carbon as a material having a low dielectric constant.

Moreover, the semiconductor layer 114 may be formed of a material such as Si, SiGe, Ge, SiC, Ga, or As. A channel is formed in the semiconductor layer 114, which is provided under the electrode pattern 118. The semiconductor layer 114 includes a silicon atom layer configured by a monolayer or multilayer. In detail, considering that a lattice constant of silicon is 5.43 Å, the characteristics of the semiconductor layer 114 is optimized when a silicon atom is stacked by 1 layer or 12 layers.

Accordingly, the semiconductor layer 114 may have a thickness of 5.5 Å to 60 Å. Furthermore, the insulating layer 116 may be formed of an oxide layer or a nitride layer.

The electrode pattern 118 may be formed of a metal material, a semiconductor material, a silicide material, or a silicate material. The metal material includes tungsten, copper, tantalum (Ta), or titanium. In this case, the electrode pattern 118 is formed in a recessed shape on the insulating layer 116. In addition, the electrode pattern 118 is formed of a graphene. When the electrode pattern 118 is formed of graphene, the graphene is formed to have multiple layers of thin film at a surface of the insulation layer 116.

A barrier layer (not shown) can further be provided under the electrode pattern 118. The barrier layer may be formed of metal (e.g., Ti, Ta, or Mo), metal nitride (e.g., TiN, TaN, or MoN), metal oxide, or metal carbide. Furthermore, the interlayer dielectric layer 106 may be formed of an oxide material, a nitride material, a carbide material, or a polymer material with carbon as a material having a low dielectric constant.

Although not shown, landing plugs for connecting to the semiconductor 114 are provided at both sides of the capping insulating layer pattern 122. An upper portion of the landing plug may be connected with a storage electrode.

In the semiconductor device according to the present invention, since the substrate 100 is formed of polymer, an application field thereof can be extended. Since an active region is not separately defined, a problem caused when a transistor is formed in a limited active region may be solved. Since the landing plug electrically coupled to the semiconductor layer 114 is directly connected to the storage electrode without interposing an additional storage electrode contact therebetween, contact resistance may be reduced.

A method for forming the semiconductor device having a structure as described above according to a first embodiment of the present invention is as follows.

Figure 2A:
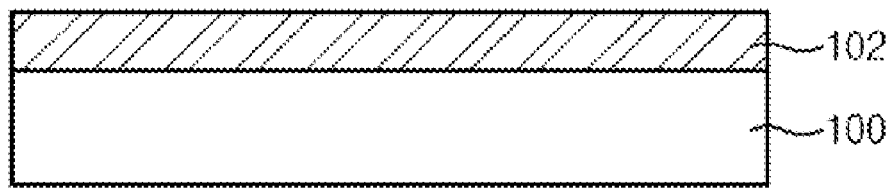
FIG. 2A to FIG. 2L are cross-sectional views illustrating a method for forming a semiconductor device according to a first embodiment of the present invention.

Referring to FIG. 2A, an isolation insulating layer 102 is formed at an upper portion of a substrate 100. In this case, the substrate 100 may be formed of a silicon substrate. The isolation insulating layer 102 is formed of oxide material, nitride material, carbide material, or carbon-containing polymer with a low dielectric constant.

The isolation insulating layer 102 may be formed by a furnace process, chemical vapor deposition (CVD), physical vapor deposition (PVD), spin coating, or thin film adhesion. Additional chemical mechanical polishing (CMP) may be performed after deposition of the isolation insulating layer 102, so that the isolation insulating layer 102 has a planarized surface.

Contrary to a conventional art which forms a device isolation layer by etching a substrate, the embodiments of the present invention need no etching process on the substrate 100. According to the conventional art, a slope may be formed over the surface of the substrate when the substrate is etched away to form a device isolation layer. Non-uniform surface of the substrates lowers an integration level of a semiconductor device. Since the present invention does not form a device isolation layer by etching the substrate, surface uniformity of the substrate can be kept at a higher level. Accordingly, higher integration can be achieved.

Besides a silicon substrate, the substrate 100 may be formed of glass or polymer. A substrate 100 formed of polymer is more flexible. Accordingly, the semiconductor device according to embodiments of the present invention is not only limited to a stiff device, but is applicable to various types of end products. Namely, the semiconductor according to embodiments of the present invention can be employed for a wide range of uses. Since non-silicon substrate needs no insulation layer between the substrate 100 and a conductive layer 104, a process of forming the isolation insulating layer 102 may be omitted.

Figure 2B:
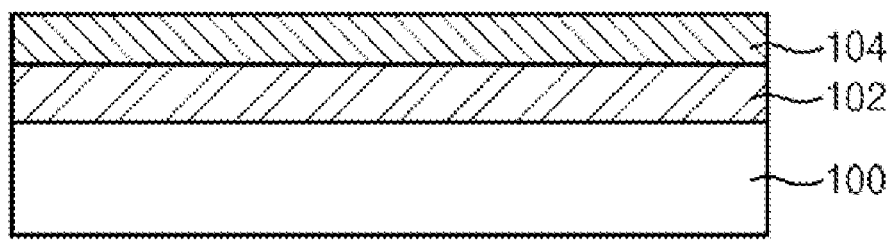

Referring to FIG. 2B, a conductive pattern 104 is formed on the isolation insulating layer 102. Here, the conductive pattern 104 functions as a bit line. To form the conductive pattern 104, a conductive layer is formed on the isolation insulating layer 102, then patterned using a mask process to form the conductive pattern 104.

In this case, the conductive layer may be formed using a furnace process, CVD, PVD, or an electro-plating process. The conductive layer may be patterned to form a bit line using a damascene process as well. The damascene process may be used when the conductive layer is formed of material which is easily oxidized or hard to etch. A conductive layer for a bit line is formed of material such as tungsten or copper. A barrier layer may be further formed between the isolation insulating layer 102 and the conductive layer 104. The barrier layer can be formed of metal (e.g., Ti, Ta, or Mo), metal nitride (e.g., TiN, TaN, or MoN), metal oxide, or metal carbide.

Figure 2C:
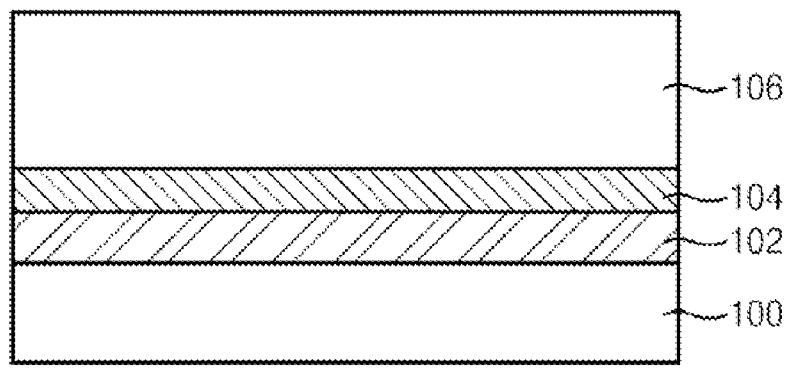

Referring to FIG. 2C, an interlayer dielectric layer 106 is formed on the conductive pattern 104. The interlayer dielectric layer 106 is used to define a bit line contact to be formed in a subsequent process. The interlayer dielectric layer 106 is formed to electrically isolate the conductive pattern 104 and a transistor to be formed in a subsequent process.

The interlayer dielectric layer 106 may be formed of an oxide material, a nitride material, a carbide material, or a carbon-containing polymer with a low dielectric constant. The interlayer dielectric layer 106 may be formed by a furnace process, chemical vapor deposition (CVD), physical vapor deposition (PVD), spin coating, or thin film adhesion.

Figure 2D:
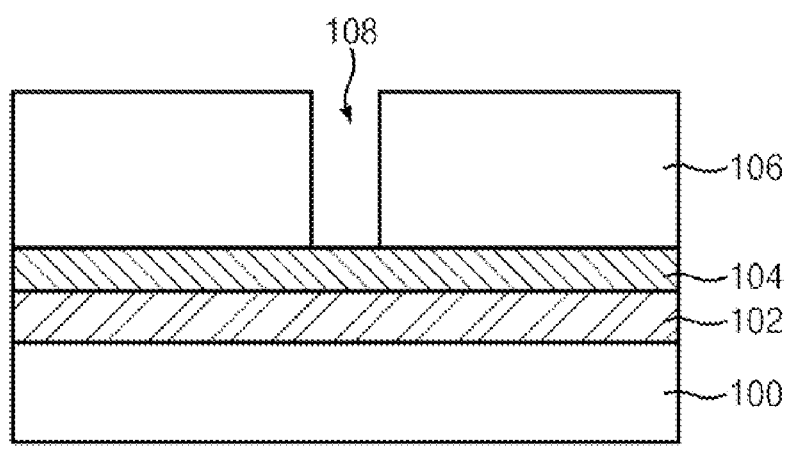

Referring to FIG. 2D, the interlayer dielectric layer 106 is etched to form a contact hole 108 exposing the conductive pattern 104.

Figure 2E:
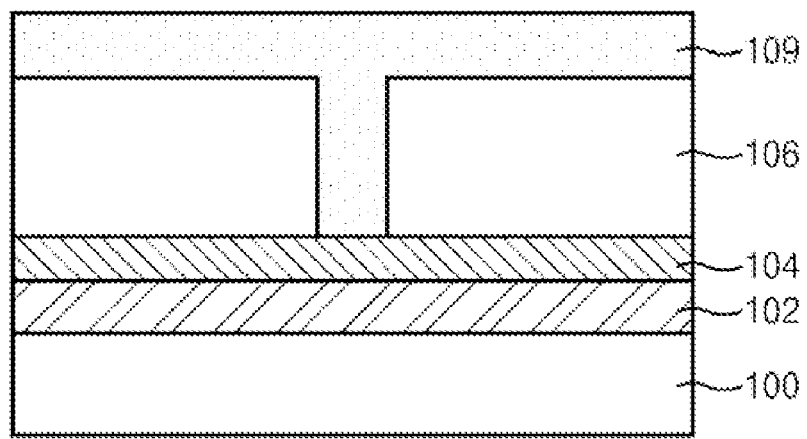
Figure 2F:
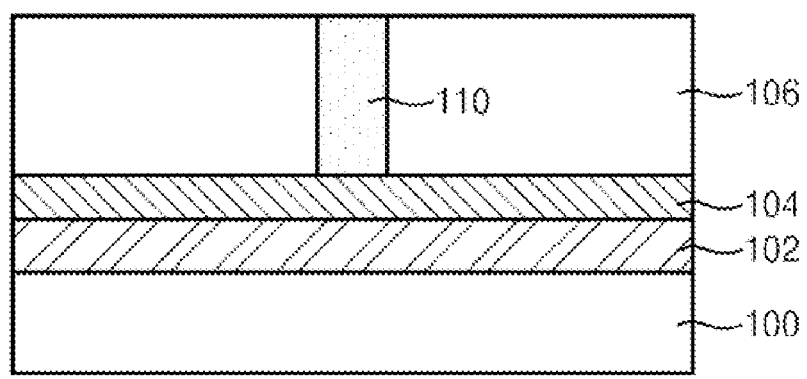

Referring to FIG. 2E and FIG. 2F, a conductive layer 109 is formed over the interlayer dielectric layer 106 so as to fill the contact hole 108 (FIG. 2E). A planarization etch process or an etch-back process is performed onto the conductive layer 109 until the interlayer dielectric layer 106 is exposed, and thereby a contact plug 110 is formed in the contact hole 108 (FIG. 2F). Here, the contact plug 110 is a bit line contact plug. Unlike a conventional art, since a formation method of the conductive pattern 104 and the contact plug 110, namely, a bit line and a bit line contact plug does not use an SAC process, a defect due to the SAC process can be prevented.

Then, a transistor is formed as follows. In this example a recess gate is employed for the transistor. A transistor according to the present invention is not limited to having a recess gate, but may be modified to various structures.

Figure 2G:
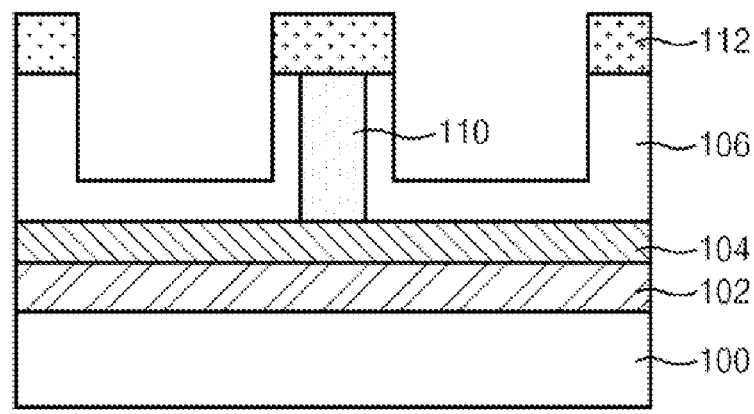

Referring to FIG. 2G, a hard mask pattern 112 defining a gate area is formed on the interlayer dielectric layer 106 including the bit line contact plug 110. The interlayer dielectric layer 106 is etched using the hard mask pattern 112 as an etch mask to form a recess. The hard mask pattern 112 is removed.

Figure 2H:
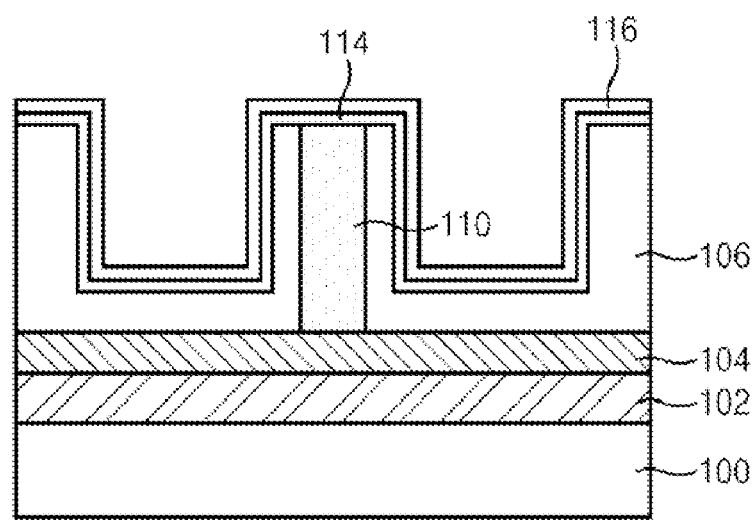

Referring to FIG. 2H, a semiconductor layer 114 is formed on the recess and the interlayer dielectric layer 106 including the contact plug 110 to define a gate pattern recess. An insulating layer 116 is formed over the semiconductor layer 114 and conformally within the gate pattern recess. In the present embodiment, the semiconductor layer 114 is formed of material such as Si, SiGe, Ge, SiC, Ga, or As. The semiconductor layer 114 is formed by a deposition process such as CVD, or PVD or an epitaxial growth, or an atomic layer deposition (ALD) process in a single layer or in a multi-layer. A channel region is defined in the semiconductor layer 114, e.g., a lower surface of the gate pattern recess. According to the present invention, an active region (or a device isolation region) is not necessary to be formed by patterning the substrate 100. The active region of the present embodiment is not defined by a patterning process but by a deposition process and thus a transistor can be easily formed free from a strict margin restriction. As a result, a highly integrated and reliable device is obtainable if a process is performed under a narrow margin condition.

A heat treatment or plasma treatment may be performed on the semiconductor layer 114. This heat treatment may improve the characteristics of the semiconductor device so as to be more uniformly controlled. Subsequently, the semiconductor layer 114 is doped with a P type dopant or an N type dopant.

Since the ions are not implanted into the substrate 100 but into the semiconductor layer 114, no junction region is formed in the substrate 100. Thus, no masking process is required for the ion implantation, and a processing time can be reduced. Moreover, since no junction region is formed in the substrate, a leakage current at the junction region can be prevented.

The semiconductor layer 114 has a thickness of 5.5 Å~60 Å The performance of the semiconductor layer 114 can be optimized with such a thickness. This thickness can be obtained by stacking 1 to 12 silicon atom layers, where a silicon has a lattice constant of 5.43 Å

The insulating layer 116 may be an oxide layer or a nitride layer. The insulating layer 116 may be additionally formed on the semiconductor layer 114 or formed by oxidizing or nitrating the semiconductor layer 114. In the method for oxidizing or nitrating the semiconductor layer 114, the insulating layer 116 may be formed by diffusion using an electric furnace or a rapid thermal annealing (RTA) process under an atmosphere of oxygen, ozone, nitrogen, or combination atmosphere thereof. Also, the semiconductor layer 114 can be formed of a metal oxide, a metal nitride, or a metal carbide using CVD, PVD, or ALD.

Figure 2I:
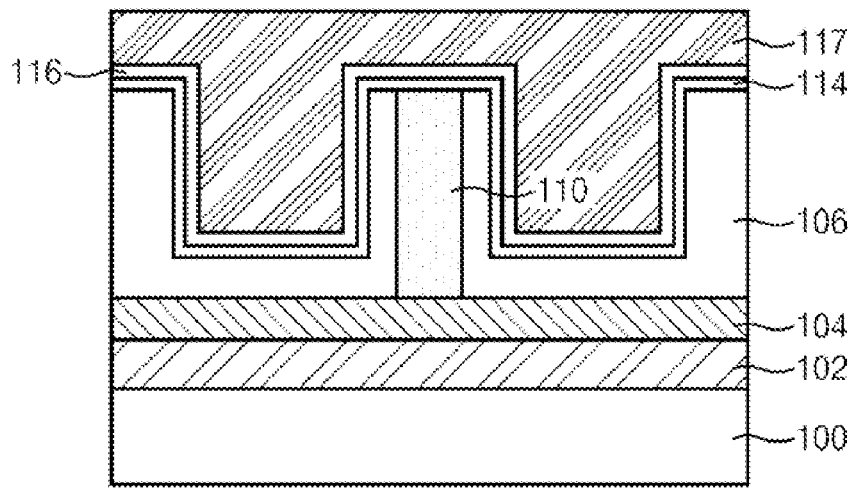

Referring to FIG. 2I, an electrode layer 117 is formed on the insulating layer 116. The electrode layer 117 serves as a gate electrode layer. The electrode layer 117 is formed by depositing a material such as metal (e.g., tungsten, copper, tantalum, or titanium), semiconductor, silicide, and silicate.

In addition, the electrode layer 117 can be formed of graphene. Since graphene is formed on the insulating layer 116 layer, an additional process to isolate the electrode layer 117 into individual gate electrode patterns is not needed.

A barrier layer (not shown) can be further formed before formation of the electrode layer 117. The barrier layer may be formed using metal (e.g., Ti, Ta, or Mo), metal nitride (e.g, TiN, TaN, or MoN), metal oxide, or metal carbide. The barrier layer and the gate electrode layer 117 may be formed using CVD, PVD, ALD, or an electro-plating method.

Figure 2J:
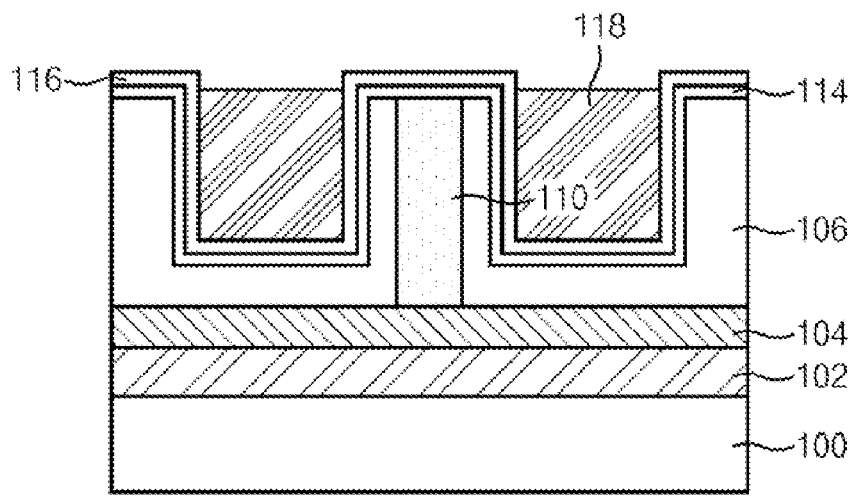

Referring to FIG. 2J, so as to isolate the electrode layer 117 into gate electrode patterns, an etch-back or a planarization etch process is performed onto the electrode layer 117 until the insulating layer 116 is exposed. When an etch-back process is employed, the damage to the semiconductor layer 114 can be prevented using the insulating layer 116 as an etch stop.

Accordingly, a material having a different etch selectivity with respect to the electrode layer 117 and the insulating layer 116 is applied as an etch reactant when performing the etch-back so that only the electrode layer 117 is removed. When the gate electrode pattern 118 is formed by performing the planarization etch process with respect to the electrode layer 117, a slurry having an excellent etch selectivity with respect to the electrode layer 117 may be used.

Figure 2K:
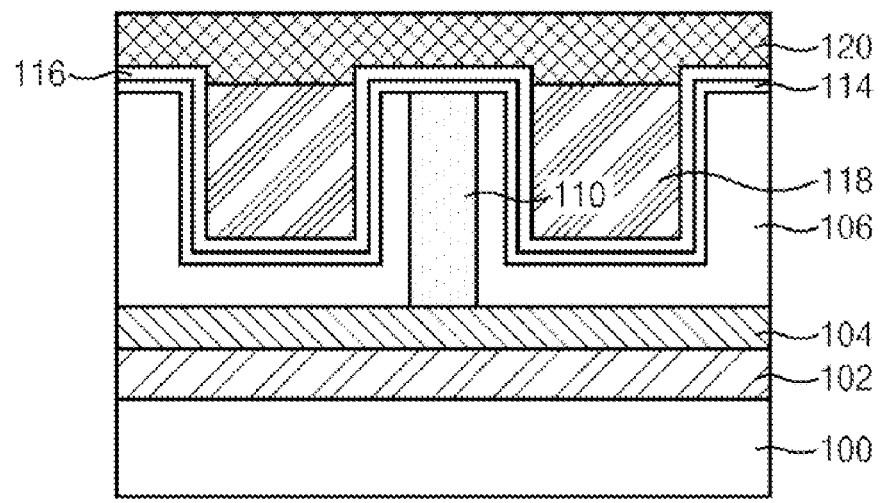

Referring to FIG. 2K, a capping insulating layer 120 capable of protecting the gate electrode pattern 118 and the bit line contact plug 110 is formed. In this case, the capping insulating layer 120 may include an oxide layer or a nitride layer. The capping insulating layer 120 can be formed of metal oxide, metal nitride, or metal carbide using CVD, PVD, or ALD.

Furthermore, the capping insulating layer 120 may be formed by oxidizing or nitrating the electrode pattern 118. In the method for oxidizing or nitrating the electrode pattern 118, the capping insulating layer 120 may be formed by diffusion using an electric furnace or rapid thermal annealing (RTA) under atmosphere of oxygen, ozone, nitrogen, or a combined atmosphere thereof.

Figure 2L:
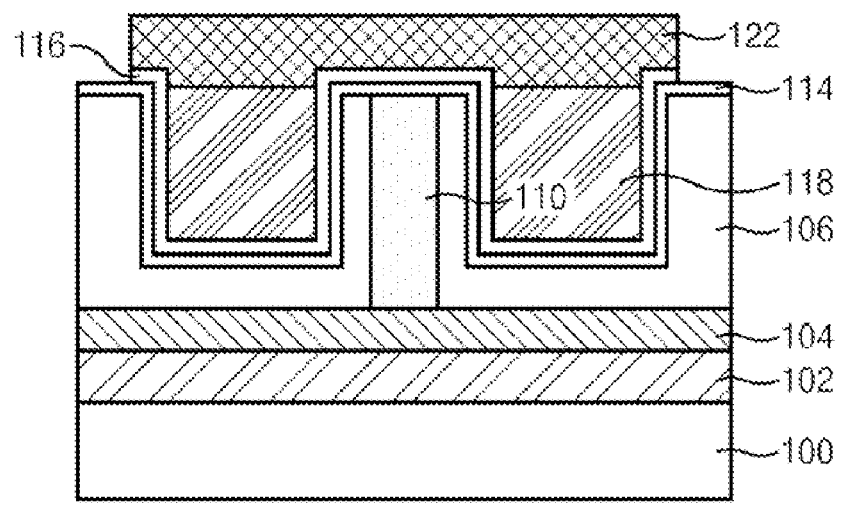

Referring to FIG. 2L, the capping insulating layer 120 and the insulating layer 116 are patterned, thereby forming a capping insulating layer pattern 122 and a insulating layer pattern with a hole exposing the semiconductor layer 114. The capping insulating layer pattern 122 and the insulating layer pattern 116 covers the gate electrode pattern 118 and the bit line contact plug 110, and the hole exposing the semiconductor layer 114 defines a region reserved for a landing plug or storage node contact plug (not shown)

The landing plug is formed by filling the hole with a material such as metal (e.g., tungsten, copper, tantalum, or titanium), semiconductor, silicide, or silicate. A barrier layer (not shown) can be further formed between the landing plug and the semiconductor layer 114. The barrier layer may be formed of metal (e.g., Ti, Ta, or Mo), metal nitride (e.g., TiN, TaN, or MoN), metal oxide, or metal carbide. The barrier layer and the electrode layer 117 may be formed using CVD, PVD, ALD, or electroplating.

Although not shown, the landing plug is connected with a storage electrode at a subsequent procedure. According to a conventional art, since both bit line and storage electrode are formed over the gate electrode pattern 118, one (e.g., the bit line) is formed at a lower level than the other (e.g., the storage electrode). Thus, at least two forming processes are required, and a contact hole for the element (e.g., the storage electrode) formed at a higher level should be formed to have a greater depth. In the present embodiment, however, a number of masking processes can be eliminated and the contact hole for the storage element can be formed at a relatively smaller depth compared with the conventional art. Significant savings in the production cost can be realized as well as significantly reducing the production time.

Hereinafter, a semiconductor device according to a second embodiment of the present invention will be described.

Figure 3:
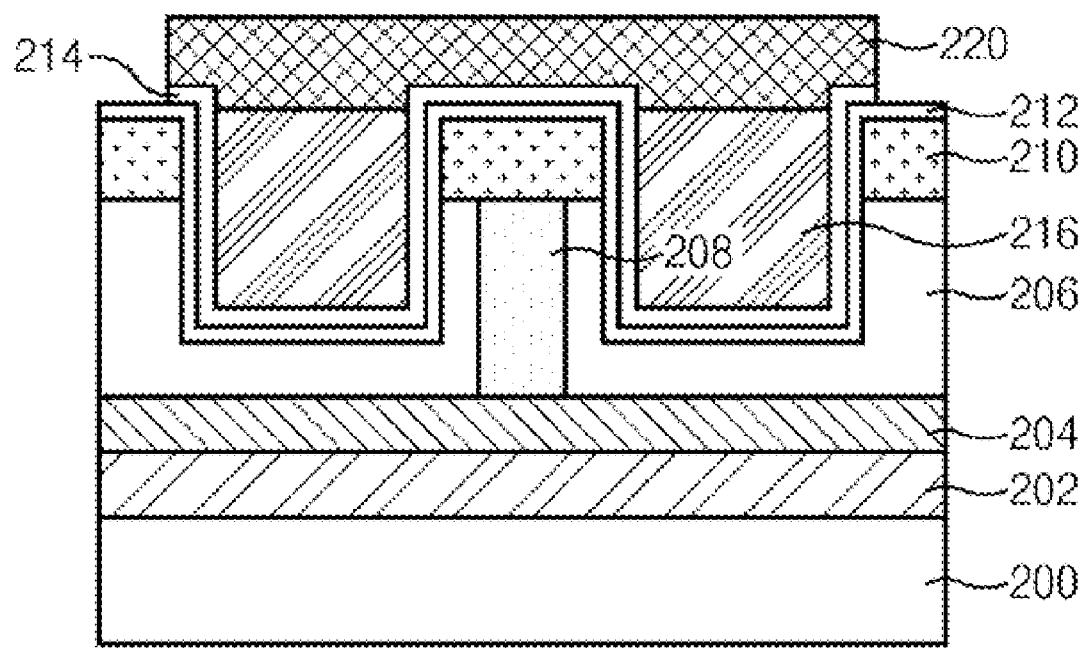
FIG. 3 is a cross-sectional view illustrating a semiconductor device according to a second embodiment of the present invention.

Referring to FIG. 3, a semiconductor device according to a second embodiment of the present invention includes: a substrate 200, a conductive pattern 204 formed on the substrate 200, an interlayer dielectric layer 206 formed on the conductive pattern 204 and including a recess, a contact plug 208 connected to the conductive pattern 204 penetrating the interlayer dielectric layer 206, a sub-semiconductor (or a secondary semiconductor) layer 210 provided on the interlayer dielectric layer 206, a semiconductor layer 212 and an insulating layer 214 formed on the sub semiconductor layer 210 to be connected to the contact plug 208, an electrode pattern 216 formed on the insulating layer 214, and a capping insulating layer pattern 220 covering the electrode patterns 216 and the insulating layer 214.

Although not shown, landing plugs to be connected to the semiconductor layer are further provided through the capping insulating layer 220. The landing plug is connected to a storage electrode (not shown).

As in the first embodiment of the present invention, the second embodiment discloses a semiconductor device employing a recess gate. However, the semiconductor device according to the second embodiment may employ another type of gate other than a recess gate. For example, a flat interlayer dielectric layer 206 and a flat gate formed over the flat interlayer dielectric layer 206 are also applicable. Structural elements of the semiconductor device according to the second embodiment have the same characteristics as those of the structural elements of the semiconductor device according to the first embodiment, and thus the detailed description thereof is appropriately omitted with reference to the description of FIG. 1.

A method for forming the semiconductor device having a structure as described above according to a second embodiment of the present invention is as follows. Since the process steps leading to the forming of the contact plug 208 are identical to those shown in FIG. 2A to FIG. 2E, the detailed description thereon is omitted. Regarding FIG. 4A to FIG. 4F, a description of elements with the same reference numerals as those shown in FIG. 2A to FIG. 2L will be omitted as well.

Figure 4A:
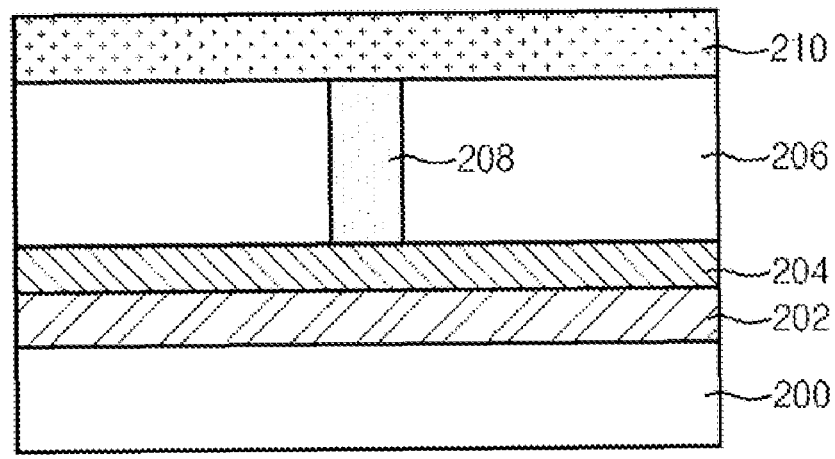
FIG. 4A to FIG. 4F are cross-sectional views illustrating a method for forming a semiconductor device according to a second embodiment of the present invention.

Referring to FIG. 4A, an interlayer dielectric layer 206 is formed on a conductive pattern 204, which is formed over a substrate 200 with an insulating layer 202 interposed therebetween, and a contact plug 208 is formed penetrating the interlayer dielectric layer 206 to connect to the conductive pattern 204. Next, a sub semiconductor layer 210 is formed between the interlayer dielectric layer 206 and the semiconductor layer 212.

One reason for forming the sub semiconductor layer 210 on the interlayer dielectric layer 206 is to facilitate electrical connection of a landing plug (or a capacitor landing plug) to be formed at a subsequent step to the semiconductor layer 212. For example, even when the semiconductor layer 212 in the area reserved for the landing plug is over-etched, damaged or even removed entirely, electrical coupling between the semiconductor layer 212 and the landing plug can be ensured by the sub semiconductor layer 210 formed below the semiconductor layer 212 which is in electrical contact with the sidewall of the semiconductor layer 212.

The sub semiconductor layer 210 may be formed using a deposition method (e.g., CVD, PVD, or ALD), or an epitaxial growth method Furthermore, after deposition of the sub semiconductor layer 210, a heat treatment or plasma treatment may be performed. Such a treatment may enhance the characteristics of a semiconductor device so as to be uniformly controlled. Subsequently, ions are implanted into the semiconductor layer 210 to form a doped sub-semiconductor layer 210 with P-type dopants or with N-type dopants.

Figure 4B:
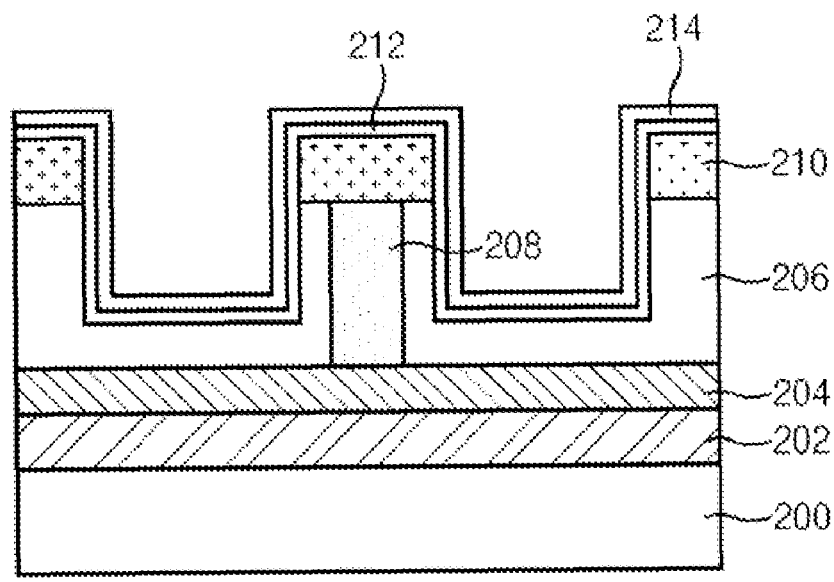

Referring to FIG. 4B, a hard mask pattern (not shown) defining a recess is formed at an upper portion of the sub semiconductor layer 210, the sub semiconductor layer 210 is etched to expose the interlayer dielectric layer 206 by using the hard mask pattern as an etch mask, and the interlayer dielectric layer 206 is then etched by using the etched sub semiconductor layer 210 as a mask, thereby forming the recess. The hard mask pattern is removed.

A semiconductor layer 212 and an insulating layer 214 are sequentially formed on the interlayer dielectric layer 206 in the recess and the sub semiconductor layer 210.

Figure 4C:
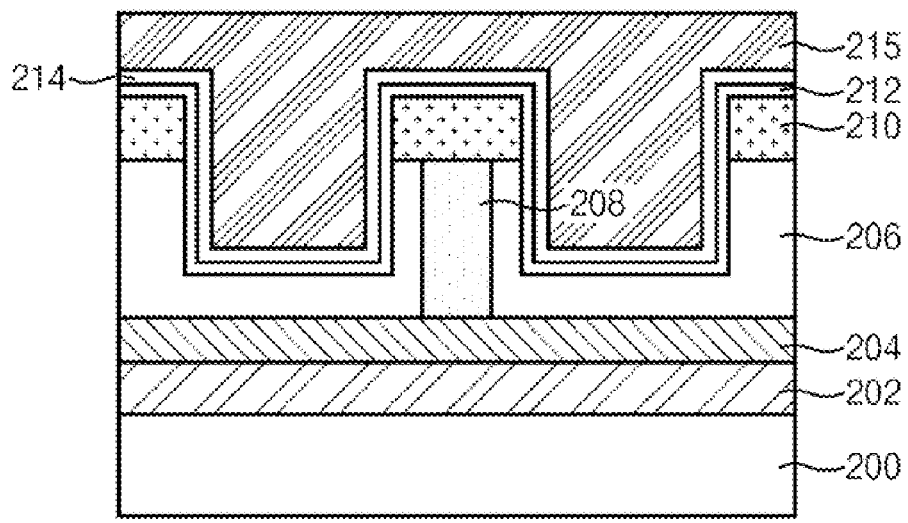

Referring to FIG. 4C, an electrode layer 215 is formed on the insulating layer 214. The electrode layer 215 is a gate electrode layer.

Figure 4D:
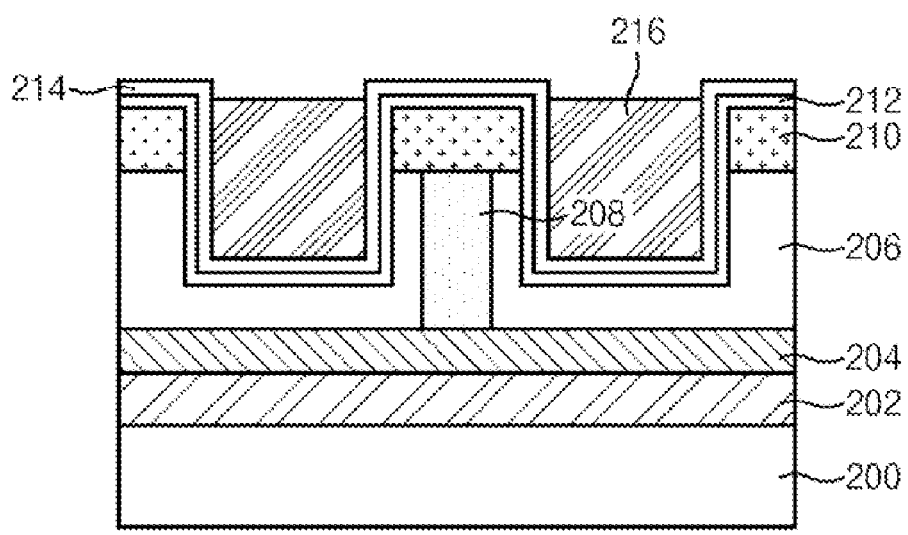

Referring to FIG. 4D, the electrode layer 215 is subject to an etch-back or a planarization etch process until the insulating layer 214 is exposed, thus forming an electrode pattern 216. The semiconductor layer 212 can be protected by the insulating layer 214 from probable damage caused by the etch-back process.

Figure 4E:
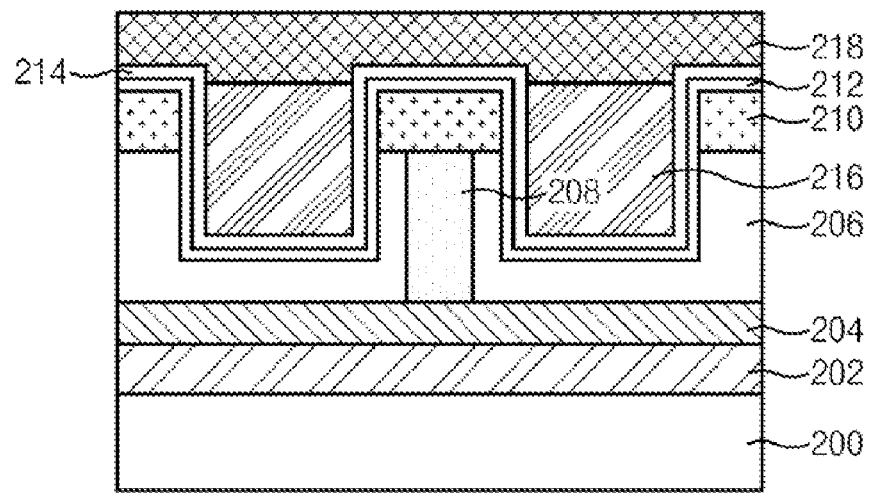
Figure 4F:
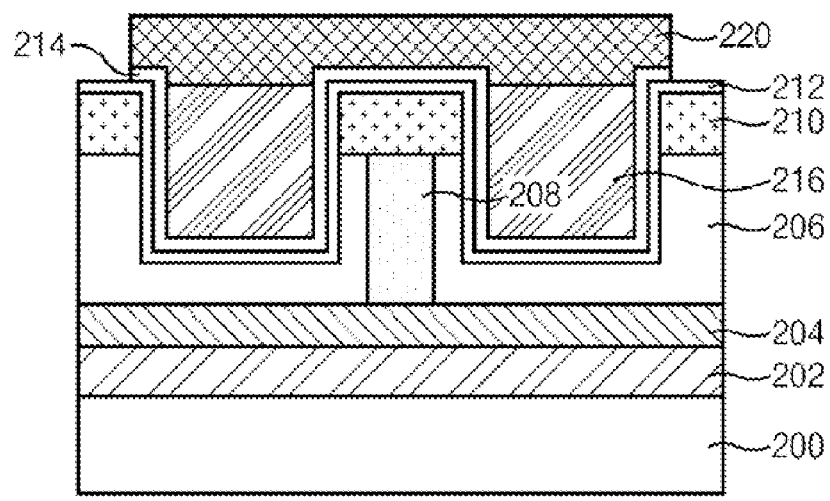

Referring to FIG. 4E and FIG. 4F, a capping insulating layer 218 capable of protecting the electrode pattern 216 and the contact plug 208 is formed. The capping insulating layer 218 is patterned to form a capping insulating layer pattern 220 with a trench exposing the insulating layer 214. The trench defines a region which is reserved to form a landing plug (not shown). The landing plug is formed to electrically connect to the semiconductor layer 212 in a subsequent process. The insulating layer 214 in the trench is removed to expose the sub semiconductor layer 210.

The semiconductor layer 212 may be damaged during the process of forming the trench or etching the insulating layer 214 in the trench. However, the sub semiconductor layer 210 formed under the semiconductor layer 212 can ensure an electrical contact between the semiconductor layer 212 and the landing plug (not shown).

The semiconductor device of the present invention provides one or more of the following advantages: (1) an additional process is not needed to define an active region; (2) an active region apart from the gate patter is not needed; (3) storage electrode contact line does not need to be formed; (4) a height of a landing plug is reduced to reduce the landing plug resistance; and a junction region does not need to be formed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A semiconductor device, comprising:
a conductive pattern formed over a substrate;
an interlayer dielectric layer formed over the conductive pattern;
a contact plug extending through the interlayer dielectric layer to contact the conductive pattern;
a semiconductor layer provided over the contact plug and the interlayer dielectric layer;
an insulating layer provided over the semiconductor layer;
a electrode pattern provided over the insulating layer; and
a capping insulating layer pattern covering upper portions of neighboring the electrode pattern provided at side portion of the contact plug.

2. The semiconductor device of claim 1, wherein the substrate is formed of glass or a polymer material.

3. The semiconductor device of claim 1, wherein the substrate is a silicon substrate.

4. The semiconductor device of claim 3, further comprising a isolation insulating layer formed between the substrate and the conductive pattern.

5. The semiconductor device of claim 4, wherein the isolation insulating layer includes an oxide material, a nitride material, a carbide material, or a polymer material with carbon as a material having a low dielectric constant.

6. The semiconductor device of claim 1, wherein the interlayer dielectric layer includes an oxide material, a nitride material, a carbide material, or a polymer material with carbon as a material having a low dielectric constant.

7. The semiconductor device of claim 1, wherein the conductive pattern includes a bit line.

8. The semiconductor device of claim 1, wherein the conductive pattern includes tungsten or copper.

9. The semiconductor device of claim 1, wherein the semiconductor layer includes Si, SiGe, Ge, SiC, Ga, or As.

10. The semiconductor device of claim 1, wherein the semiconductor layer has a thickness of 5.5 Å to 60 Å.

11. The semiconductor device of claim 1, wherein the semiconductor layer includes a silicon atom layer configured by a monolayer.

12. The semiconductor device of claim 1, wherein the semiconductor layer includes a silicon atom layer configured by a multilayer.

13. The semiconductor device of claim 1, wherein the electrode pattern includes any of a metal material, a semiconductor material, a silicide material, or a silicate material.

14. The semiconductor device of claim 1, wherein the electrode pattern includes graphene.

15. The semiconductor device of claim 1, further comprising:
a landing plug contacting the semiconductor layer that is provided side portion of the capping insulating layer.

16. A semiconductor device comprising:
a conductive pattern formed over a substrate;
an interlayer dielectric layer formed over the conductive pattern;
a contact plug extending through the interlayer dielectric layer to contact the conductive pattern;
a sub semiconductor layer provided over the contact plug and the interlayer dielectric layer;
a semiconductor layer provided over the interlayer dielectric layer and the sub semiconductor layer;
an insulating layer provided over the semiconductor layer;
a electrode pattern provided over the insulating layer; and
a capping insulating layer pattern covering upper portions of neighboring the electrode pattern provided at side portion of the contact plug.

17. The semiconductor device of claim 16, wherein the sub semiconductor layer includes Si, SiGe, Ge, SiC, Ga, or As.

18. The semiconductor device of claim 16, further comprising:
a landing plug contacting the sub semiconductor layer that is provided side portion of the capping insulating layer.

19. A method of manufacturing a semiconductor device, the method comprising:
forming a conductive pattern over a substrate;
forming a interlayer dielectric layer over the conductive pattern;
forming a contact plug extending through the interlayer dielectric layer to contact the conductive pattern;
forming a semiconductor layer over the contact plug and the interlayer dielectric layer;
forming an insulating layer over the semiconductor layer;
forming a electrode pattern over the insulating layer; and
forming a capping insulating layer pattern covering upper portions of neighboring the electrode pattern at side portion of contact plug.

20. The method of claim 19, the method further comprising:
forming a isolation insulating layer on the substrate.

21. The method of claim 19, wherein forming a conductive pattern is performed by a damascene process.

22. The method of claim 19, wherein forming a conductive pattern comprises:
depositing a conductive material on the substrate;
forming a photo resist pattern on the conductive material by exposure or development processes; and
etching the conductive material by using the photo resistor pattern as an etch mask.

23. The method of claim 19, after forming the contact plug, further comprising:
forming a hard mask pattern at an upper portion of the interlayer dielectric layer; and etching the interlayer dielectric layer by using the hard mask pattern as an etch mask to form a recess.

24. The method of claim 19, wherein forming a semiconductor layer is performed by chemical vapor deposition, physical vapor deposition, or atomic layer deposition.

25. The method of claim 19, after forming a semiconductor layer, further comprising performing heat treatment or plasma treatment with respect to the semiconductor layer.

26. The method of claim 19, after forming a semiconductor layer, further comprising implanting ions into the semiconductor layer.

27. The method of claim 19, wherein forming an insulating layer is performed by chemical vapor deposition, physical vapor deposition, or atomic layer deposition.

28. The method of claim 23, wherein forming an electrode pattern comprises:
    forming an electrode layer on the insulating layer; and
    performing an etch-back or planarization etch process with respect to the electrode layer.

29. The method of claim 28, wherein performing an etch-back process with respect to the electrode layer removes the electrode layer by using the insulating layer as an etch stopping layer.

30. The method of claim 19, after forming a capping insulation layer, further comprising removing the insulating layer on the semiconductor layer by using the capping insulating pattern as a mask.

31. The method of claim 30, after removing the insulating layer, further comprising forming landing plugs contacting the semiconductor layer that is provided at side portion of the capping insulating layer.

32. A method of manufacturing a semiconductor device, the method comprising:
    forming a conductive pattern over a substrate;
    forming a interlayer dielectric layer over the conductive pattern;
    forming a contact plug extending through the interlayer dielectric layer to contact the conductive pattern;
    forming a sub semiconductor layer on the interlayer dielectric layer;
    forming a semiconductor layer over the contact plug and the sub semiconductor layer;
    forming an insulating layer over the semiconductor layer;
    forming a electrode pattern over the insulating layer; and
    forming a capping insulating layer pattern covering upper portions of neighboring the electrode pattern at side portion of contact plug.

33. The method of claim 32, wherein forming a sub semiconductor layer is performed by chemical vapor deposition, physical vapor deposition, or atomic layer deposition.

34. The method of claim 32, after forming a sub semiconductor layer, further comprising performing heat treatment or plasma treatment with respect to the sub semiconductor layer.

35. The method of claim 32, after forming a sub semiconductor layer, further comprising implanting ions into the sub semiconductor layer.

36. The method of claim 32, after forming the sub semiconductor layer, further comprising:
    forming a hard mask pattern in an upper portion of the interlayer dielectric layer; and
    etching the sub semiconductor layer and the interlayer dielectric layer by using the hard mask pattern as an etch mask to form a recess.

37. The method of claim 32, after forming a capping insulation layer, further comprising performing cleaning to remove the insulating layer and the semiconductor layer by using the capping insulating pattern as a mask.

38. The method of claim 37, after removing the insulating layer and the semiconductor layer, further comprising forming a landing plug connected to the sub semiconductor layer.

* * * * *